United States Patent
Chikugawa (10) Patent No.: US 7,593,236 B2
(45) Date of Patent: Sep. 22, 2009

(54) SEMICONDUCTOR LIGHT EMITTING DEVICE

(75) Inventor: Hiroshi Chikugawa, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 123 days.

(21) Appl. No.: 11/590,345

(22) Filed: Oct. 30, 2006

(65) Prior Publication Data

US 2007/0097683 A1    May 3, 2007

(30) Foreign Application Priority Data

Oct. 31, 2005    (JP) .............................. 2005-317552

(51) Int. Cl.
   *H05K 7/00*    (2006.01)
(52) U.S. Cl. .................. 361/760; 361/762; 361/719; 361/810; 257/81; 257/99
(58) Field of Classification Search ................ 361/762, 361/719, 783, 810, 760; 257/88, 89, 81, 257/99

See application file for complete search history.

(56) References Cited

U.S. PATENT DOCUMENTS

| | | | | |
|---|---|---|---|---|
| 6,174,070 | B1 * | 1/2001 | Takamura et al. | 362/183 |
| 6,495,861 | B1 * | 12/2002 | Ishinaga | 257/99 |
| 6,573,653 | B1 * | 6/2003 | Ishinaga | 313/512 |
| 6,614,103 | B1 | 9/2003 | Durocher et al. | |
| 7,111,964 | B2 * | 9/2006 | Suehiro et al. | 362/328 |
| 7,175,305 | B2 * | 2/2007 | Martineau | 362/244 |
| 7,210,807 | B2 * | 5/2007 | Sakamoto et al. | 362/84 |
| 7,391,153 | B2 * | 6/2008 | Suehiro et al. | 313/512 |
| 7,405,093 | B2 * | 7/2008 | Andrews | 438/26 |
| 7,473,933 | B2 * | 1/2009 | Yan | 257/88 |
| 2003/0165061 | A1 * | 9/2003 | Martineau | 362/297 |
| 2004/0207999 | A1 * | 10/2004 | Suehiro et al. | 362/84 |
| 2004/0229391 | A1 * | 11/2004 | Ohya et al. | 438/26 |
| 2004/0257797 | A1 | 12/2004 | Suehiro et al. | |
| 2005/0133808 | A1 * | 6/2005 | Uraya et al. | 257/99 |
| 2005/0179036 | A1 * | 8/2005 | Yamazaki et al. | 257/66 |

(Continued)

FOREIGN PATENT DOCUMENTS

JP    2002-141558 A    5/2002

(Continued)

*Primary Examiner*—Tuan T Dinh
*Assistant Examiner*—Xiaoliang Chen
(74) *Attorney, Agent, or Firm*—Morrison & Foerster LLP (57) ABSTRACT

A semiconductor light emitting device 1 includes: a plurality of light emitting elements 2; a light emitting element mounting member 3 on which said light emitting elements 2 are mounted; and a coating member 4 which covers a surface of the light emitting element mounting member 3 where said light emitting elements 2 are mounted. In the semiconductor light emitting device 1, said light emitting element mounting member 3 is provided with depressed sections 7 at positions where said light emitting elements 2 are respectively mounted; said coating member 4 is provided with through holes at positions respectively corresponding to the depressed sections 7; inner wall surfaces of (i) each of the depressed sections 7 and (ii) each of the through holes respectively form (i) a first reflection surface 8 and (ii) a second reflection surface 9; and the second reflection surface 9 has an angle with respect to an optical axis of said light emitting element 2 smaller than an angle of said first reflection surface 8 with respect to an optical axis of said light emitting element 2.

19 Claims, 3 Drawing Sheets

U.S. PATENT DOCUMENTS

| | | | |
|---|---|---|---|
| 2005/0280017 A1* | 12/2005 | Oshio et al. | 257/99 |
| 2006/0012992 A1* | 1/2006 | Lee | 362/237 |
| 2006/0060867 A1* | 3/2006 | Suehiro | 257/81 |
| 2007/0278511 A1* | 12/2007 | Ohno et al. | 257/99 |
| 2007/0284993 A1* | 12/2007 | Kim et al. | 313/483 |
| 2008/0023721 A1* | 1/2008 | Lee et al. | 257/99 |

FOREIGN PATENT DOCUMENTS

| | | |
|---|---|---|
| JP | 2004-128241 A | 4/2004 |
| JP | 2005-005437 A | 1/2005 |
| JP | 2005-093681 A | 4/2005 |
| JP | 2005-150408 A | 6/2005 |

\* cited by examiner

SEMICONDUCTOR LIGHT EMITTING DEVICE

This Nonprovisional application claims priority under 35 U.S.C. § 119(a) on Patent Application No. 317552/2005 filed in Japan on Oct. 31, 2005, the entire contents of which are hereby incorporated by reference.

FIELD OF THE INVENTION

The present invention relates to a semiconductor light emitting device utilized as a light source of an illumination apparatus.

BACKGROUND OF THE INVENTION

A semiconductor light emitting device using a high-intensity light emitting element such as an LED (Light Emitting Device) has attracted attention as a light source of an illumination apparatus. The semiconductor light emitting device includes at least one light emitting element mounted in a plane of a light emitting element mounting member and emits light by a current supplied externally. The illumination apparatus is, for example, a backlight for a liquid crystal display apparatus.

In order to utilize the semiconductor light emitting device as the light source of the illumination apparatus, it is necessary to efficiently extract the light emitted from the semiconductor light emitting device to a side thereof facing an object to be irradiated (For example, an LCD panel in case of a backlight for a liquid crystal display apparatus).

However, the light emitting element emits light from an upper surface and a lateral surface of the light emitting element. In other words, the light emitting element emits light, from the upper surface of the element, not only in a substantially parallel direction but also in an oblique direction with respect to an optical axis (an axis passing through a center point of the light emitting element and, moreover, the axis being perpendicular to the surface of the semiconductor light emitting device where the light emitting element is mounted).

In this way, the light emitted from the light emitting element does not always travel along the optical axis. Accordingly, much of the light cannot be utilized, and light utilization efficiency of the semiconductor light emitting device decreases.

In order to solve the problem, (i) light emitted from the lateral surface of the light emitting element in the perpendicular direction with respect to the optical axis and (ii) light emitted from the upper surface of the light emitting element in an oblique direction with respect to the optical axis must be refracted in a direction of the optical axis. An arrangement for refracting the light emitted from the light emitting element in the direction of the optical axis is disclosed in: Japanese Unexamined Patent Publication (Tokukai 2005-5437 (published on Jan. 6, 2005)), Japanese Unexamined Patent Publication (Tokukai 2004-128241 (published on Apr. 22, 2004)), Japanese Unexamined Patent Publication (Tokukai 2002-141558 (published on May 17, 2002)), Japanese Unexamined Patent Publication (Tokukai 2005-150408 (published on Jun. 9, 2005)), and USP No. 2004/0257797 A1 (Date of patent: Dec. 23, 2004).

The five documents above disclose an semiconductor light emitting device having at least one depressed section(s) on a light emitting element mounting member, wherein an inner wall surface of the depressed section forms a reflection surface having a predetermined angle with respect to the optical axis and every depressed section mentioned above has the light emitting element provided in it.

Figure 10:
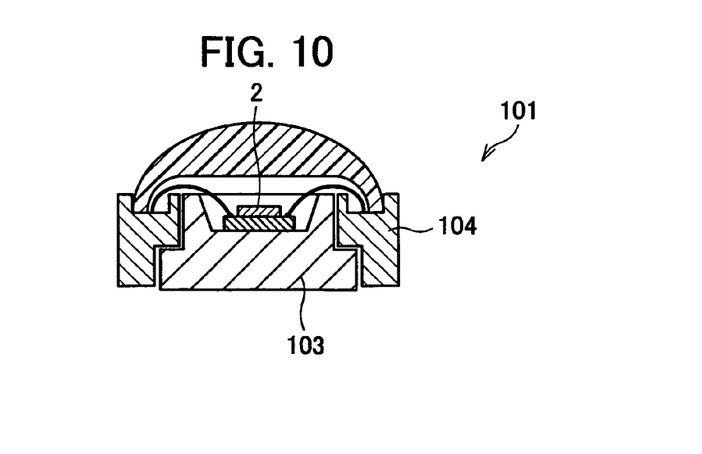
FIG. 10 is a front view of a conventional semiconductor light emitting device.

As illustrated in FIG. 10, conventionally, among semiconductor light emitting devices in which the light emitting element is assembled in a package with a lead terminal and the like, there is a high-power semiconductor light emitting device 101 including a large sized element whose power consumption is particularly high. In the high-power semiconductor light emitting device 101, the light emitting element is assembled via a submount on a heat dissipation member for heat dissipation.

In order to reflect the light, which is emitted from the upper surface of the light emitting element in the oblique direction, as much as possible by means of the reflection surface, it is necessary to make the depressed section deep to a certain extent. However, the reflection surface has the predetermined angle with respect to the optical axis. Accordingly, the deeper the depressed section becomes, the larger a diameter of an opening of the depressed section on the upper surface of the light emitting element mounting member becomes.

Therefore, in the conventional arrangement, the light emitting elements cannot be mounted close to each other on one light emitting element mounting member. When only a small number of the light emitting elements can be mounted on one light emitting element mounting member in this way, many semiconductor light emitting devices are needed to constitute a light source device having light intensity equivalent to a light source device including many light emitting elements. As a result, the light source device becomes very large.

Figure 9:
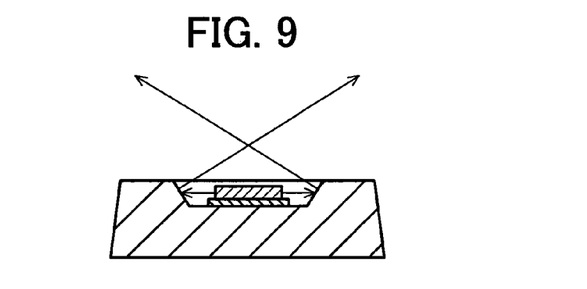
FIG. 9 is a cross section view illustrating light paths in a case where light emitted from lateral surfaces of the light emitting element is reflected by a reflection surface having a small angle with respect to the optical axis.

In addition, in the conventional arrangement, in a case where the angle of the reflection surface with respect to the optical axis is arranged to be small so as to decrease the diameter of the opening of the depressed section on the upper surface of the light emitting element mounting member, it becomes difficult to reflect the light emitted from the lateral surface of the light emitting element in the direction of the optical axis, as illustrated in FIG. 9. Therefore, an original purpose of the reflection surface cannot be achieved.

SUMMARY OF THE INVENTION

The present invention is attained in view of the problems mentioned above. An object of the present invention is to provide a semiconductor light emitting device which emits high-intensity light having directivity.

In order to achieve the object mentioned above, a semiconductor light emitting device includes: a plurality of light emitting elements; a light emitting element mounting member on which the light emitting elements are mounted; and a coating member which covers a surface of the light emitting element mounting member where the light emitting elements are mounted. In the semiconductor light emitting device, the light emitting element mounting member is provided with depressed sections at positions where the light emitting elements are respectively mounted; the coating member is provided with through holes at positions respectively corresponding to the depressed sections; inner wall surfaces of (i) each of the depressed sections and (ii) each of the through holes respectively form (i) a first reflection surface and (ii) a second reflection surface; and the second reflection surface has an angle with respect to an optical axis of the light emitting element smaller than an angle of the first reflection surface with respect to an optical axis of the light emitting element.

In the arrangement mentioned above, two reflection surfaces whose angles with respect to the optical axis are different are provided. The angle of the second reflection surface with respect to the optical axis is smaller than the angle of the first reflection surface with respect to the optical axis. In the arrangement mentioned above, compared with an arrangement including a conventional reflection surface whose angle with respect to the optical axis has only one level, the diameter of the opening on the upper surface of the semiconductor light emitting device becomes smaller.

This makes it possible to prevent adjacent reflection surfaces from interfering each other, even if a distance between adjacent light emitting elements is reduced to a certain degree. Therefore, it becomes possible to mount the light emitting elements closer to each other.

Moreover, in the arrangement mentioned above, it is possible to reduce a diameter of the opening of the depressed section provided on the upper surface of the light emitting element mounting member, without decreasing an angle of the first reflection surface, with respect to the optical axis, where light emitted from the lateral surface of the light emitting element is reflected.

As a result, the semiconductor light emitting device can include many light emitting elements mounted on one light emitting element mounting member. Moreover, it becomes possible to reflect the light emitted from the lateral surfaces of the light emitting elements, in the direction of the optical axis. Accordingly, it is possible to obtain the semiconductor light emitting device which emits high-intensity light having directivity.

For a fuller understanding of the nature and advantages of the invention, reference should be made to the ensuing detailed description taken in conjunction with the accompanying drawings.

DESCRIPTION OF THE EMBODIMENTS

An embodiment of the present invention is explained below with reference to FIGS. 1 through 8.

A semiconductor light emitting device of the present embodiment includes light emitting element chips realized by LEDs mounted in a plane of a light emitting element mounting member and emits light by a current supplied externally to the light emitting elements.

Figure 1:
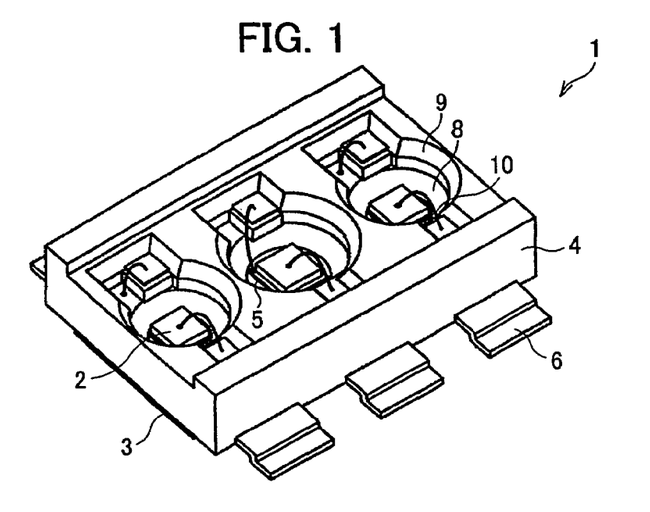
FIG. 1 is a perspective view illustrating a semiconductor light emitting device of an embodiment of the present invention.
Figure 2:
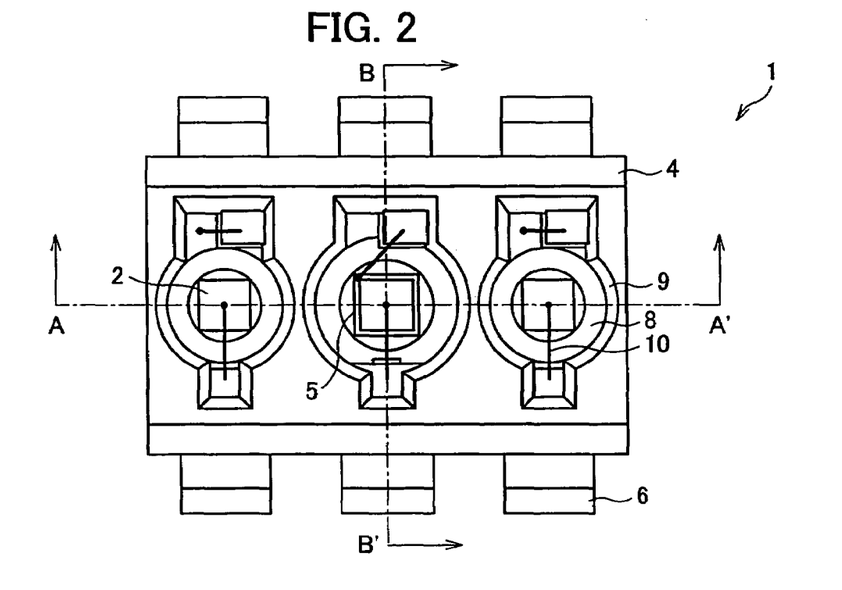
FIG. 2 is a plan view of a semiconductor light emitting device of the embodiment of the present invention.
Figure 3:
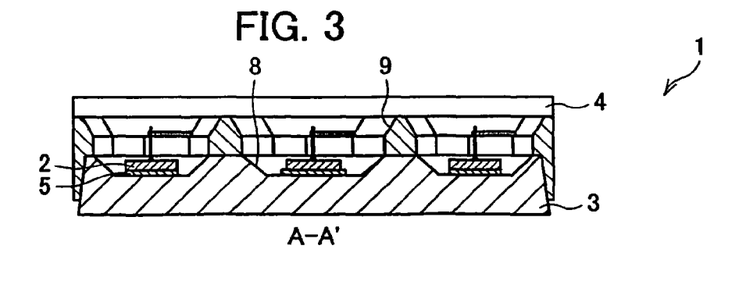
FIG. 3 is a cross sectional view taken along a line A-A' of FIG. 2.
Figure 4:
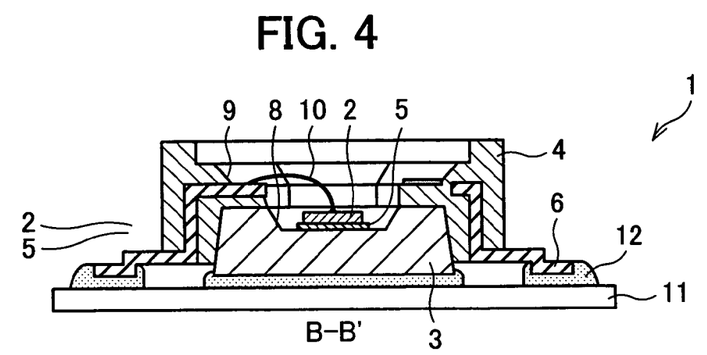
FIG. 4 is a cross sectional view taken along a line B-B' of FIG. 2.

FIG. 1 is a perspective view illustrating a semiconductor light emitting device 1 of the present embodiment. FIG. 2 is a plan view of the semiconductor light emitting device of the present embodiment. FIG. 3 is a cross sectional view taken along a line A-A' of FIG. 2. FIG. 4 is a cross sectional view taken along a line B-B' of FIG. 2.

The structure of the semiconductor light emitting device 1 of the present embodiment is explained below with reference to FIGS. 1 through 4.

As illustrated in FIGS. 1 and 2, the semiconductor light emitting device 1 of the present embodiment includes light emitting elements 2, light emitting element mounting member 3, a coating member 4, submounts 5, lead terminals 6, and bonding wires 10.

Figure 5:
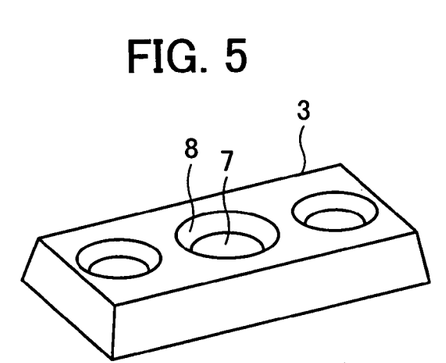
FIG. 5 is a perspective view illustrating a light emitting element mounting member of the embodiment of the present invention.

The light emitting element mounting member 3 becomes a base on which the light emitting elements 2 are mounted. This light emitting element mounting member 3, as illustrated in FIGS. 2 and 3, has an upper surface and a bottom surface which are parallel to each other and respectively have rectangular shapes. The light emitting element mounting member 3 also includes, as illustrated in FIG. 5, trapezoid-shaped lateral surfaces, which (i) slightly slope down from the upper surface toward the bottom surface and (ii) have lower bases slightly longer than upper bases. Therefore, (i) a cross section taken along the line A-A' (FIG. 3) and (ii) a cross section taken along the line B-B' (FIG. 4) of the light emitting element mounting member 3 are trapezoid-shaped.

Moreover, on the upper surface of the light emitting element mounting member 3, three depressed sections 7 are provided in line in a direction of the length of the light emitting element mounting member 3. Each of the depressed sections 7 has a shape such that diameters of its opening, which appear on cross sections parallel to the upper surface of the light emitting element mounting member 3, increase with distance from the bottom surface to the upper surface of the light emitting element mounting member 3. Each of the depressed sections 7 has a conical surface on its inner wall side.

The depressed sections 7 have bottom surfaces whose diameters are different from one another. On the bottom surfaces of the depressed sections 7, the light emitting elements 2, which are different in size so as to respectively correspond to the diameters of the bottom surfaces of the depressed sections 7, are mounted by die bonding (Accordingly, the bottom surfaces of the depressed sections 7 serve as surfaces for die bonding, which are hereinafter referred to as "die bonding surfaces"). This makes it possible to mount the light emitting elements 2 different in size on one light emitting element mounting member 3. The depressed sections 7 are arranged such that distances (depths) from the upper surfaces of the light emitting element mounting member 3 to the bottom surfaces of the depressed sections 7 are identical to one another.

Moreover, an inner wall of each of the depressed sections 7 forms a first reflection surface 8 that reflects light emitted from the light emitting element 2 mounted on the bottom surface of the depressed section 7.

The light emitting element mounting member 3 also dissipates heat emitted from the light emitting elements 2. For this reason, the light emitting element mounting member 3 is preferably made of copper, copper alloy or aluminum, which are excellent in heat conductivity. In order to improve reflectance, each of the first reflection surfaces 8 of the light emitting element mounting member 3 is preferably plated with any of substances of high reflectance, Ag, Ni, Pt, and Pd, which are used either singly or in a suitable combination of two or more kinds.

A shape of the light emitting element mounting member 3 is not limited to the shape mentioned above. For example, the light emitting element mounting member 3 may have a rectangular parallelepiped shape.

Moreover, a material of the light emitting element mounting member 3 is not limited to the material mentioned above. For example, the light emitting element mounting member 3 may be a plated aluminum nitride (AlN).

Furthermore, the shapes of the depressed sections 7 may be identical with each other. The number of the depressed sections 7 is also not limited to three.

The submount 5 is provided between the light emitting element mounting member 3 and the light emitting element 2. In a case where one electrode of the light emitting element 2 is on the bottom surface of the depressed section 7 (that is, on the die bonding surface where the light emitting element 2 is mounted), the electrode of the light emitting element 2 comes into direct contact with the light emitting element mounting member 3 which is made of metal. This causes the electrode of the light emitting element 2 to become common. The submount 5 is provided so as to prevent the electrode from becoming common. Moreover, the submount 5 is provided in a case where the die bonding surface needs to be flat when the light emitting element 2 is a flip chip-type light emitting element.

The submount 5 is preferably made of material having (i) an electric insulation property and (ii) heat conductivity that is equal to that of copper, copper alloy or aluminum which the light emitting element mounting member 3 is made of. To be more specific, the submount 5 is made of silicon carbide (SiC), silicon carbide impregnated with aluminum or magnesium, or aluminum nitride (AlN). This makes the heat conductivities of the submount 5 and the light emitting element mounting member 3 substantially equal. As a result, the heat emitted by the light emitting element 2 is efficiently conducted to the light emitting element mounting member 3 via the submount 5.

The light emitting element 2 is an LED which is formed with a substantially square substrate and a light emitting layer and/or the like provided thereon and has a predetermined thickness. In the present embodiment, the light emitting element 2, as illustrated in FIG. 3, is die-bonded on the bottom surface of each of the depressed sections 7 via the submount 5. However, the light emitting element 2 may also be directly die-bonded on the bottom surface of the depressed section 7 by a brazing material or the like.

As illustrated in FIG. 4, each of the lead terminals 6 is electrically connected by solder 12 or the like to a circuit pattern (not illustrated in the figure) formed on a circuit substrate 11 where the light emitting element mounting member 3 is mounted. This allows the lead terminal 6 to supply a current from the circuit pattern to the light emitting element 2. The lead terminal 6 is electrically connected to the light emitting element 2 by the bonding wire 10 made of, for example, Au wire.

The lead terminal 6 extends in a direction perpendicular to the direction of the length of the light emitting element mounting member 3, starting from an end of the opening of the depressed section 7 formed on the upper surface of the light emitting element mounting member 3. The lead terminal 6 is bent downward at the end of the upper surface of the light emitting element mounting member 3. The lead terminal 6 extends along the lateral surface to a predetermined position. The predetermined position is in a level higher than the bottom surface of the light emitting element mounting member 3. Moreover, the lead terminal 6 is bent so as to be perpendicular with respect to the lateral surface of the light emitting element mounting member 3 at the predetermined position. Then, the lead terminal 6 is further bent downward so as to be connected to the circuit pattern.

The lead terminal 6 is attached in such a manner that a part of the lead terminal 6 is buried by the coating member 4 which covers the upper surface of the light emitting element mounting member 3. Resin forming the coating member 4 electrically insulates the lead terminal 6 from the light emitting element mounting member 3. Moreover the lead terminal 6 is, as illustrated in FIG. 2, formed in such a manner that the end of the lead terminal 6, which is connected to the circuit pattern, protrudes from the lateral surface of the light emitting element mounting member 3. The direction of this protrusion is perpendicular with respect to a direction in which the three light emitting elements 2 are aligned.

This eliminates the need for a space for the lead terminal 6 between the light emitting elements 2 which are adjacent to each other. This makes it possible to provide the depressed sections 7, in which the light emitting elements 2 are respectively mounted, close to each other on the light emitting element mounting member 3. As a result, many light emitting elements 2 can be mounted on one light emitting element mounting member 3. Thus, it is possible to attain the semiconductor light emitting device 1 that emits light of high intensity.

The coating member 4 is formed with resin by insert molding to cover the light emitting element mounting member 3 and the lead terminals 6. Through holes are provided on an upper surface of the coating member 4 at positions corresponding to the depressed sections 7. Moreover, as with the depressed sections 7, the through hole has a shape such that diameters of the through hole increase with distance from the light emitting element mounting member 3 to the upper surface of the coating member 4. The through hole has a second reflection surface 9 on its inner wall side. In the present embodiment, the second reflection surface 9 is a reflection surface which forms only one angle level with an optical axis. Alternatively, the reflection surface 9 may be a reflection surface which forms two or more angle levels with the optical axis.

The coating member 4 covers the upper surface and the lateral surface of the light emitting element mounting member 3, but the coating member 4 is not formed on the bottom surface of the light emitting element mounting member 3.

Because the coating member 4 is formed by insert molding, the light emitting element mounting member 3 may come off the coating member 4. The light emitting element mounting member 3 may have at least one groove on the lateral surface of the light emitting element mounting member 3 to prevent the light emitting element mounting member 3 from coming off the coating member 4.

The coating member 4 may be formed with a white resin to form reflection surfaces as the second reflection surfaces 9. Alternatively, the second reflection surfaces 9 may be formed by plating the coating member 4 with a material of a high reflectance.

Next, the structures of the first reflection surfaces 8 and the second reflection surfaces 9 in the semiconductor light emitting device 1 are explained specifically.

Figure 6:
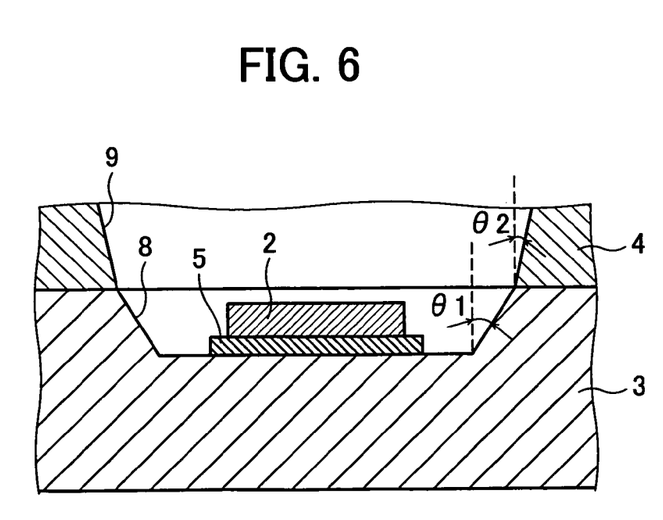
FIG. 6 is a cross sectional view illustrating (i) an angle of a first reflection surface formed on the light emitting element mounting member with respect to an optical axis and (ii) an angle of a second reflection surface formed on a coating member with respect to the optical axis.

FIG. 6 is a cross sectional view illustrating angles of the first reflection surface 8 and the second reflection surface 9, with respect to the optical axis. The optical axis is an axis which (a) passes through a center point of the light emitting element 2 and (b) is perpendicular to a surface on which the light emitting element 2 of the semiconductor light emitting device 1 is mounted.

As explained above, the first reflection surface 8 is the inner wall surface of the depressed section 7 provided on the light emitting element mounting member 3, and the second reflection surface 9 is the inner wall surface of the through hole provided on the coating member 4.

As illustrated in FIG. 6, the first reflection surface 8 and the second reflection surface 9 are provided continuously. The angle of the second reflection surface 9 with respect to the optical axis is arranged to be smaller than the angle of the first reflection surface 8 with respect to the optical axis.

Specific angles of the first reflection surface 8 and the second reflection surface 9 with respect to the optical axis are explained below. It is preferable that an angle $\theta 1$ of the first reflection surface 8 with respect to the optical axis is in a range of 40 to 50 degrees. Especially an angle of 45 degrees is preferable for the angle $\theta 1$. Moreover, it is preferable that an angle $\theta 2$ of the second reflection surface 9 with respect to the optical axis is in a range of 20 to 40 degrees. Especially an angle of 30 degrees is preferable for the angle $\theta 2$.

By adjusting the angles of the first reflection surface 8 and the second reflection surface 9 with respect to the optical axis to the above-mentioned angles, the light emitted from the lateral surface and the upper surface of the light emitting element 2, especially the light emitted in a direction which forms a large angle with the optical axis, is converged so as to travel in a direction which forms a smaller angle with the optical axis. Accordingly, the light emitted from the semiconductor light emitting device 1 has directivity in a direction of the optical axis. As a result, the semiconductor light emitting device 1 provides a high utilization efficiency of light traveling in the direction of the optical axis.

In order to reflect the light emitted from the light emitting element 2 as much as possible, it is preferable that the second reflection surface 9 is sufficiently high in the direction of the optical axis.

Moreover, the depressed section 7 may have a depth (a) equal to or more than a thickness of the light emitting element 2 and (b) equal to or less than a length of a diagonal line of the upper surface of the light emitting element 2. With this arrangement, the light emitted from the lateral surface of the light emitting element 2 is inevitably reflected in the direction of the optical axis by the first reflection surface 8 provided on the inner wall surface of the depressed section 7 because the depth of the depressed section 7 is equal to or more than the thickness of the light emitting element 2. Moreover, the light emitted from the upper surface of the light emitting element 2 in an oblique direction is reflected in the direction of the optical axis by the second reflection surface 9 because the depth of the depressed section 7 is equal to or less than the length of the diagonal line of the upper surface of the light emitting element 2.

The light emitted from (i) the lateral surface and (ii) the upper surface of the light emitting element 2 is efficiently reflected in the direction of the optical axis by the first reflection surface 8 and the second reflection surface 9 arranged as mentioned above. As a result, it becomes possible that the semiconductor light emitting device 1 emits light having directivity in the direction of the optical axis.

As mentioned above, a semiconductor light emitting device 1 includes: a plurality of light emitting elements 2; a light emitting element mounting member 3 on which the light emitting elements 2 are mounted; and a coating member 4 which covers a surface of the light emitting element mounting member 3 where the light emitting elements 2 are mounted. In the semiconductor light emitting device 1, the light emitting element mounting member 3 is provided with depressed sections 7 at positions where the light emitting elements 2 are respectively mounted; the coating member 4 is provided with through holes at positions respectively corresponding to the depressed sections 7; inner wall surfaces of (i) each of the depressed sections 7 and (ii) each of the through holes respectively form (i) a first reflection surface 8 and (ii) a second reflection surface 9; and the second reflection surface 9 has an angle with respect to an optical axis of the light emitting element 2 smaller than an angle of the first reflection surface 8 with respect to an optical axis of the light emitting element 2.

In the arrangement mentioned above, two reflection surfaces whose angles with respect to the optical axis are different are provided. The angle of the second reflection surface 9 with respect to the optical axis is smaller than the angle of the first reflection surface 8 with respect to the optical axis. In the arrangement mentioned above, compared with an arrangement including a conventional reflection surface whose angle with respect to the optical axis has only one level, the diameter of the opening on the upper surface of the semiconductor light emitting device 1 becomes smaller.

This makes it possible to prevent adjacent reflection surfaces from interfering each other, even if a distance between adjacent light emitting elements 2 is reduced to a certain degree. Therefore, it becomes possible to mount the light emitting elements 2 closer to each other.

Moreover, in the arrangement mentioned above, it is possible to reduce a diameter of the opening of the depressed section 7 provided on the upper surface of the light emitting element mounting member 3, without decreasing an angle of the first reflection surface 8, with respect to the optical axis, where light emitted from the lateral surface of the light emitting element 2 is reflected.

As a result, the semiconductor light emitting device 1 can include many light emitting elements 2 mounted on one light emitting element mounting member 3. Moreover, it becomes possible to reflect the light emitted from the lateral surfaces of the light emitting elements 2, in the direction of the optical axis. Accordingly, it is possible to obtain the semiconductor light emitting device which emits high-intensity light having directivity.

It also becomes possible to reduce size of the semiconductor light emitting device 1 because the light emitting elements 2 can be mounted close to each other on the light emitting element mounting member 3. For example, compared with the conventional semiconductor light emitting device in which one light emitting element is mounted on one light emitting element mounting member, the size of the semiconductor light emitting device 1 can be substantially equal to or smaller than the size of the conventional semiconductor light emitting device.

As the light emitting elements 2 of the present embodiment, the light emitting elements 2 of 0.9 mm or more per side are used. Moreover, the light emitting elements 2 are mounted on the light emitting element mounting member 3 so as to be spaced evenly 4 mm or less apart.

As mentioned above, the larger the number of the light emitting elements 2 mounted on one light emitting element mounting member 3 becomes, the more a total amount of heat emitted from the light emitting elements 2 becomes. Therefore, if the heat emitted from the light emitting elements 2 is not dissipated outside efficiently, the heat emitted may influence intensity of the light emitted from the light emitting elements 2 or durability of the light emitting elements 2.

In the semiconductor light emitting device 1, the light emitting element mounting member 3 is given a specific feature so as to efficiently dissipate heat emitted from the light emitting elements 2. Specifically, as illustrated in FIG. 4, the bottom surface of the light emitting element mounting member 3 is arranged (i) so as to be exposed out of the coating member 4 and, moreover, (ii) to protrude more than the bottom surface of the lead terminals 6. The bottom surface of the light emitting element mounting member 3 is connected to a circuit substrate 11 by using solder or Ag paste.

Concerning a heat dissipation efficiency of the semiconductor light emitting device 1 having the arrangement mentioned above, a heat resistance indicating the heat dissipation efficiency is approximately 10° C./W, which is equal to or more than a heat dissipation efficiency of the conventional semiconductor light emitting device 101 as illustrated in FIG. 10. Specifically, the conventional semiconductor light emitting device 101 is arranged so that a bottom surface of a light emitting element mounting member 103 having a light emitting element 2 thereon is exposed from a coating member 104.

A thickness of the light emitting element mounting member 3 from the bottom surface of the depressed section 7 to the bottom surface of the light emitting element mounting member 3 should be equal to or more than a length of one side of the light emitting element 2. This increases a volume of the light emitting element mounting member 3 and therefore increases a heat capacity correspondingly. As a result, a rise in temperature of the light emitting element mounting member 3 due to the heat emitted from the light emitting element 2 does not easily occur. This allows the semiconductor light emitting device 1 to suppress adverse effects of the heat emitted from the light emitting elements 2.

Moreover, when the light emitting element mounting member 3 is mounted on the circuit substrate 11 in such a manner that the bottom surface of the light emitting element mounting member 3 protrude more than the bottom surfaces of the lead terminals 6, the whole bottom surface of the light emitting element mounting member 3 inevitably comes into contact with the circuit substrate 11. As a result, the light emitting element mounting member 3 can efficiently dissipate the heat emitted from the light emitting elements 2 onto the circuit substrate 11.

The circuit substrate 11 is constituted by (i) aluminum or carbon fiber, which is excellent in heat conductivity, and (ii) an insulation layer formed on the aluminum or carbon fiber. The insulation layer is made of resin having a high heat conductivity which is mixed with inorganic filler. Moreover, on the circuit substrate 11, a circuit pattern is formed by copper foil.

Although the heat conductivity of the insulation layer is high, the heat conductivity of the insulation layer is lower than that of aluminum or the like. Consequently, a heat resistance becomes high due to the insulation layer when the semiconductor light emitting device 1 is mounted on the circuit substrate 11. As a result, the heat dissipation efficiency of the semiconductor light emitting device 1 decreases.

In view of this, in the semiconductor light emitting device 1, an area of the bottom surface of the light emitting element mounting member 3 is as large as possible. Moreover, an area of the upper surface of the light emitting element mounting member 3 is decreased since the upper surface of the light emitting element mounting member 3 has a little influence on the heat dissipation. This increases the area where the light emitting element mounting member 3 is in contact with the circuit substrate 11. Actually, in order to efficiently dissipate the heat emitted from the light emitting elements 2 onto the circuit substrate 11, it is better that the area where the bottom surface of the light emitting element mounting member 3 is in contact with the circuit substrate 11 is as large as possible. As a result, the semiconductor light emitting device 1 can efficiently dissipate the heat emitted from the light emitting element 2 to the circuit substrate 11.

In this case, especially, it is highly likely that the light emitting element mounting member 3 comes off the coating member 4. Therefore, it is preferable that the light emitting element mounting member 3 has at least one groove on the lateral surface of the light emitting element mounting member 3 to prevent the light emitting element mounting member 3 from coming off the coating member 4.

Thus, the light emitting element mounting member 3 made of a material having an excellent heat conductivity, for example, copper, copper alloy, or the like, is in direct contact with the circuit substrate 11. This allows the heat emitted from the light emitting elements 2 to be dissipated onto the circuit substrate 11 via the light emitting element mounting member 3.

Since the semiconductor light emitting device 1 is arranged as mentioned to increase its heat radiation efficiency, it is possible to mount high-power light emitting elements 2 of 1 W or more input power close to each other on the light emitting element mounting member 3.

Figure 7:
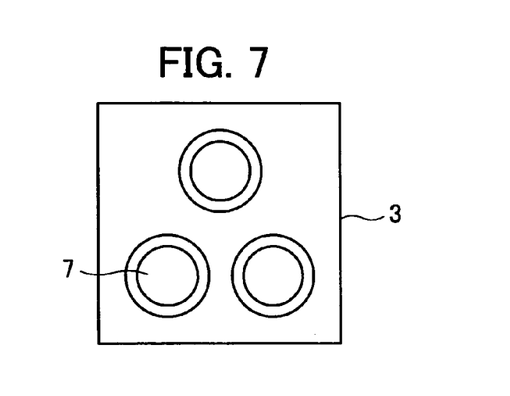
FIG. 7 is a plan view illustrating one example of positions where three depressed sections are provided on the light emitting element mounting member of the embodiment of the present invention.
Figure 8:
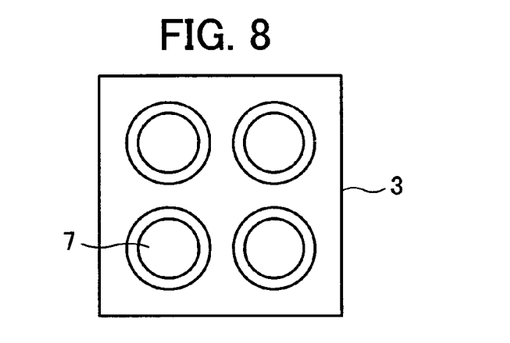
FIG. 8 is a plan view illustrating one example of positions where four depressed sections are provided on the light emitting element mounting member of the embodiment of the present invention.

Modified examples in locations of the depressed sections 7 (that is, locations of the light emitting elements 2) on the light emitting element mounting member 3 are explained with reference to FIGS. 7 and 8. FIG. 7 illustrates one modified example of positions of three depressed sections 7 formed on the light emitting element mounting member 3 of the present embodiment. FIG. 8 illustrates one modified example of positions of four depressed sections 7 formed on the light emitting element mounting member 3 of the present embodiment.

In a case where three depressed sections 7 are provided on the light emitting element mounting member 3 in a manner as illustrated in FIG. 7, each of the depressed sections 7 may be provided so as to be located at a vertex of a triangle. In a case where four depressed sections 7 are provided on the light emitting element mounting member 3 in a manner as illustrated in FIG. 8, each of the depressed sections 7 may be provided so as to be located at a vertex of a quadrangle.

In the semiconductor light emitting device of the present invention, it is preferable that the angle of the first reflection surface with respect to the optical axis is in a range of 40 degrees to 50 degrees; and the angle of the second reflection surface with respect to the optical axis is in a range of 20 degrees to 40 degrees.

In the arrangement mentioned above, the light emitted from the lateral surfaces and the upper surfaces of the light emitting elements is more efficiently reflected in the direction of the optical axis. As a result, it becomes possible that the semiconductor light emitting device emits light having a higher directivity.

In the semiconductor light emitting device of the present invention, it is especially preferable that the angle of the first reflection surface with respect to the optical axis is 45 degrees; and the angle of the second reflection surface with respect to the optical axis is 30 degrees.

In the arrangement mentioned above, the light emitted from the lateral surface and the upper surface of the light emitting elements is especially efficiently reflected in the direction of the optical axis. As a result, it becomes possible that the semiconductor light emitting device emits light having an especially high directivity.

The semiconductor light emitting device of the present invention further includes lead terminals which supply currents to the light emitting elements. In the semiconductor light emitting device of the present invention, the depressed sections are arranged in line; and the lead terminals are provided so as to protrude from the light emitting element mounting member in a direction perpendicular to a direction where the depressed sections are arranged in line.

The arrangement mentioned above eliminates the need for a space for the lead terminal between the light emitting elements which are adjacent to each other. This makes it possible to provide the depressed sections, in which the light emitting elements are respectively mounted, close to each other on the light emitting element mounting member. As a result, many light emitting elements can be mounted on one light emitting element mounting member. Thus, it is possible to attain the semiconductor light emitting device that emits light of high intensity.

In the semiconductor light emitting device of the present invention, the light emitting elements are rectangular-shaped boards; and a length from a bottom surface of the depressed section to a bottom surface of the light emitting element mounting member is equal to or longer than a length of one side of the light emitting element.

The arrangement mentioned above increases a volume of the light emitting element mounting member and therefore increases a heat capacity correspondingly. As a result, a rise in temperature of the light emitting element mounting member due to the heat emitted from the light emitting element does not easily occur. This allows the semiconductor light emitting device to suppress adverse effects of the heat emitted from the light emitting elements.

The semiconductor light emitting device of the present invention further includes lead terminals which supply currents to the light emitting elements. In the semiconductor light emitting device of the present invention, a bottom surface of the light emitting element mounting member is exposed out of the coating member; and the bottom surface of the light emitting element mounting member is in a same level as the bottom surfaces of the lead terminals or protrudes more than the bottom surfaces of the lead terminals.

In the arrangement mentioned above, when the light emitting element mounting member is mounted on a substrate, the bottom surface of the light emitting element mounting member can come into contact with the substrate. This makes it possible to efficiently dissipate the heat emitted from the light emitting elements onto the substrate.

In the semiconductor light emitting device of the present invention, a bottom surface of the light emitting element mounting member is exposed out of the coating member; and the bottom surface of the light emitting element mounting member has an area larger than an upper surface of the light emitting element mounting member where the depressed sections are formed, the bottom surface being opposite to the upper surface.

The arrangement mentioned above increases the area where the light emitting element mounting member is in contact with the substrate on which the light emitting element mounting member is mounted. In order to efficiently dissipate the heat emitted from the light emitting elements onto the circuit substrate, it is better that the area where the bottom surface of the light emitting element mounting member is in contact with the circuit substrate is as large as possible. As a result, the semiconductor light emitting device can efficiently dissipate the heat emitted from the light emitting elements to the circuit substrate.

In the semiconductor light emitting device of the present invention, the light emitting element mounting member may be made of copper or copper alloy.

In the arrangement mentioned above, the light emitting element mounting member can efficiently dissipate the heat emitted from the light emitting elements onto the substrate.

In the semiconductor light emitting device of the present invention, the light emitting element mounting member may be made of aluminum nitride (AlN).

In the arrangement mentioned above, the light emitting element mounting member can efficiently dissipate the heat emitted from the light emitting elements onto the substrate.

In the semiconductor light emitting device of the present invention, the first reflection surface is plated with any of substances, Ag, Ni, Pt, and Pd, which are used either singly or in a combination of two or more kinds.

In the arrangement mentioned above, the first reflection surface of the depressed section provided on the light emitting element mounting member are plated with a material having high reflectance, and the reflectance of the first reflection surface therefore becomes high. This allows the light emitted from the lateral surface of the light emitting element to be efficiently reflected in the direction of the optical axis.

The semiconductor light emitting device of the present invention further includes submounts having electric insulation property each being provided between the light emitting element and the bottom surface of the depressed section. The submounts are made of silicon carbide (SiC), silicon carbide impregnated with aluminum or magnesium, or aluminum nitride (AlN).

In the arrangement mentioned above, the heat conductivities of the submounts and the light emitting element mounting member become equivalent. This makes it possible to efficiently conduct the heat emitted from the light emitting elements, from the submounts to the light emitting element mounting member.

In the semiconductor light emitting device of the present invention, the depressed sections have mutually different diameters.

In the arrangement mentioned above, it is possible to mount light emitting elements of different sizes on one light emitting element mounting member.

In the semiconductor light emitting device of the present invention, the light emitting elements are rectangular-shaped boards; and a depth of the depressed section is (i) equal to or more than a thickness of the light emitting element and, moreover, (ii) equal to or less than a length of a diagonal line of the light emitting element.

With the arrangement mentioned above, the light emitted from the lateral surface of the light emitting element is inevitably reflected in the direction of the optical axis by the first reflection surface provided on the inner wall surface of the depressed section because the depth of the depressed section is equal to or more than the thickness of the light emitting element. Moreover, the light emitted from the upper surface of the light emitting element in an oblique direction is reflected in the direction of the optical axis by the second reflection surface because the depth of the depressed section is equal to or less than the length of the diagonal line of the upper surface of the light emitting element.

In the semiconductor light emitting device of the present invention, the depressed sections provided on the light emitting element mounting member are three depressed sections, and each of the depressed sections is provided so as to be located at a vertex of a triangle.

In the arrangement mentioned above, the three depressed sections are provided so that each of the depressed sections is located at a vertex of a triangle. In this way, in the semiconductor light emitting device, positions of the depressed sections can be changed to be suitable for its use.

In the semiconductor light emitting device of the present invention, the depressed sections provided on the light emitting element mounting member are four depressed sections, and each of the depressed sections is provided so as to be located at a vertex of a quadrangle.

In the arrangement mentioned above, the four depressed sections are provided so that each of the depressed sections is located at a vertex of a quadrangle. In this way, in the semiconductor light emitting device, positions of the depressed sections can be changed to be suitable for its use.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor light emitting device comprising:
   at least one light emitting element;
   a light emitting element mounting member on which said light emitting element is mounted; and
   a coating member which covers a surface of said light emitting element mounting member where said light emitting element is mounted, wherein:
   said light emitting element mounting member is provided with a depressed section at a position where said light emitting element is mounted, wherein only one light emitting element is mounted inside the depressed section;
   said coating member is provided with a through hole at a position corresponding to the depressed section;
   inner wall surfaces of (i) the depressed section and (ii) the through hole respectively form (i) a first reflection surface and (ii) a second reflection surface; and
   the second reflection surface has an angle with respect to an optical axis of said light emitting element smaller than an angle of said first reflection surface with respect to the optical axis of said light emitting element,
   said semiconductor light emitting device further comprising a lead terminal which supplies current to said light emitting element, the lead terminal being formed such that a part thereof is buried in said coating member, the lead terminal extending from an end of an opening of the depressed section in a direction substantially perpendicular to a direction of a length of the light emitting element mounting member.

2. The semiconductor light emitting device as set forth in claim 1, wherein:
   the angle of the first reflection surface with respect to the optical axis is in a range of 40 degrees to 50 degrees; and
   the angle of the second reflection surface with respect to the optical axis is in a range of 20 degrees to 40 degrees.

3. The semiconductor light emitting device as set forth in claim 1, wherein
   the angle of the first reflection surface with respect to the optical axis is 45 degrees; and
   the angle of the second reflection surface with respect to the optical axis is 30 degrees.

4. The semiconductor light emitting device as set forth in claim 1, wherein,
   a plurality of said depressed sections are provided,
   the depressed sections are arranged in line; and
   said lead terminal is provided so as to protrude from said light emitting element mounting member in a direction perpendicular to a direction where the depressed sections are arranged in line.

5. The semiconductor light emitting device as set forth in claim 1, wherein:
   said light emitting elements are rectangular-shaped boards; and
   a length from a bottom surface of the depressed section to a bottom surface of said light emitting element mounting member is equal to or longer than a length of one side of said light emitting element.

6. The semiconductor light emitting device as set forth in claim 1, wherein:
   a bottom surface of said light emitting element mounting member is exposed out of said coating member; and
   the bottom surface of said light emitting element mounting member is in a same level as the bottom surfaces of said lead terminals or protrudes more than the bottom surfaces of said lead terminals.

7. The semiconductor light emitting device as set forth in claim 1, wherein:
   a bottom surface of said light emitting element mounting member is exposed out of said coating member; and
   the bottom surface of said light emitting element mounting member has an area larger than an upper surface of said light emitting element mounting member where the depressed sections are formed, the bottom surface being opposite to the upper surface.

8. The semiconductor light emitting device as set forth in claim 1, wherein
   said light emitting element mounting member is made of copper or copper alloy.

9. The semiconductor light emitting device as set forth in claim 1, wherein
   said light emitting element mounting member is made of aluminum nitride (AlN).

10. The semiconductor light emitting device as set forth in claim 1, wherein
    the first reflection surface is plated with any of substances, Ag, Ni, Pt, and Pd, which are used either singly or in a combination of two or more kinds.

11. The semiconductor light emitting device as set forth in claim 1, further comprising:
    submounts having electric insulation property each being provided between said light emitting element and the bottom surface of the depressed section.

12. The semiconductor light emitting device as set forth in claim 11, wherein
    said submounts are made of silicon carbide (SiC), silicon carbide impregnated with aluminum or magnesium, or aluminum nitride (AlN).

13. The semiconductor light emitting device as set forth in claim 1, wherein a plurality of said depressed sections are provided and the depressed sections have mutually different diameters.

14. The semiconductor light emitting device as set forth in claim 1, wherein
    said light emitting elements are rectangular-shaped boards; and a depth of the depressed section is (i) equal to or more than a thickness of said light emitting element and, moreover, (ii) equal to or less than a length of a diagonal line of said light emitting element.

15. The semiconductor light emitting device as set forth in claim 1, wherein:
the depressed sections provided on said light emitting element mounting member are three depressed sections, and each of the depressed sections is provided so as to be located at a vertex of a triangle.

16. The semiconductor light emitting device as set forth in claim 1, wherein
the depressed sections provided on said light emitting element mounting member are four depressed sections, and each of the depressed sections is provided so as to be located at a vertex of a quadrangle.

17. The semiconductor light emitting device as set forth in claim 1, wherein the first reflection surface and the second reflection surface are provided continuously.

18. The semiconductor light emitting device as set forth in claim 1, wherein the light emitting element mounting member has a groove formed on a lateral surface thereof.

19. The semiconductor light emitting device as set forth in claim 7, wherein the light emitting element mounting member has a groove formed on a lateral surface thereof.

* * * * *